Oct. 22, 1974 J. J. DI FAZIO ET AL 3,843,362

LATENT IMAGE MASK REPAIR

Filed Nov. 17, 1972 2 Sheets-Sheet 1

Oct. 22, 1974 J. J. DI FAZIO ET AL 3,843,362

LATENT IMAGE MASK REPAIR

Filed Nov. 17, 1972 2 Sheets-Sheet 2

United States Patent Office 3,843,362
Patented Oct. 22, 1974

3,843,362
LATENT IMAGE MASK REPAIR

James Joseph Di Fazio and George Joseph Giuffre, Wappingers Falls, and Arthur Frederick Karsch, Yorktown Heights, N.Y., assignors to International Business Machines Corporation, Armonk, N.Y.

Filed Nov. 17, 1972, Ser. No. 307,692
Int. Cl. G03c 5/00, 5/09
U.S. Cl. 96—38.3 5 Claims

ABSTRACT OF THE DISCLOSURE

Defects in exposure masks for integrated circuit manufacture are avoided or corrected. For example, a diazo material is exposed to ultraviolet light and the exposed areas become colorless so that a visible latent image is formed. The latent image is used to obtain precise repair of mask pattern geometry because the operator can see the results of the initial exposure before developing the permanent diazo dye image.

BACKGROUND OF THE INVENTION

This invention relates generally to the formation of photographic images and more specifically to the formation of exposure masks used in the manufacture of integrated circuits.

Exposure masks having extremely fine geometry are employed in the manufacture of microminiaturized integrated circuits. The masks are used to expose in a patternwise manner a layer of resist material so that a resist image can be developed on the surface of a semiconductor substrate. The mask patterns have areas which are opaque to the resist exposing radiation but which may be sufficiently transparent for alignment purposes. The masks must be free from defects which would cause holes or unwanted geometry to occur in the resist image. Such defects in the resist layer would result in a reduced yield of operable integrated circuit devices.

The mask making process is expensive and a series of masks are required in order to produce one integrated circuit device. In order to avoid the complete loss of a mask due to defects which occur during preparation or during subsequent handling of the mask various methods of mask repair have been accomplished.

Traditionally, the technique for mask repair is to coat at least the defect area with a resist and then spot expose with a suitable variable aperture exposure device to permit either omitted or unwanted geometry to be eliminated. One difficulty in this process is that, particularly where the repair of the edge of an opaque mask geometry is involved, the operator cannot be sure he has exposed the resist in the precise areas required to make the repair. This can only be verified after the development of the resist. If the exposure was incorrect, then the process must be repeated, perhaps several times before the required repair is correctly accomplished.

BRIEF SUMMARY OF THE INVENTION

In accordance with this invention a process is provided whereby the correctness of the repair of the mask geometry can be determined prior to the development of a permanent image. The process forms a visible latent image so that defects in the exposure can be detected. These defects are then corrected prior to the development of a permanent mask image.

In one aspect of the invention, a diazo material is used to form the opaque areas of the mask. The diazo material has a discernible color prior to exposure. The exposed areas of a diazo type material are rendered transparent by the exposure. Unwanted, unexposed areas in the latent image are located and corrected by spot exposure. Unwanted, exposed areas are located, recoated with diazo and the correct exposure accomplished prior to development.

In another aspect of the invention, diazo material is used to correct defects on an existing mask so that unwanted or missing geometry is added or deleted as the case may be in a precise manner.

DETAILED DESCRIPTION

Figure 1A:
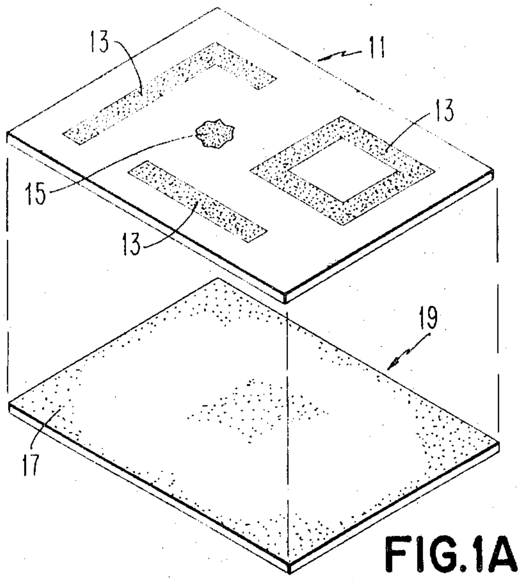
FIGS. 1A–D schematically illustrate an embodiment of the process of the invention showing the correction of unwanted opaque areas in a mask pattern.
Figure 1B:
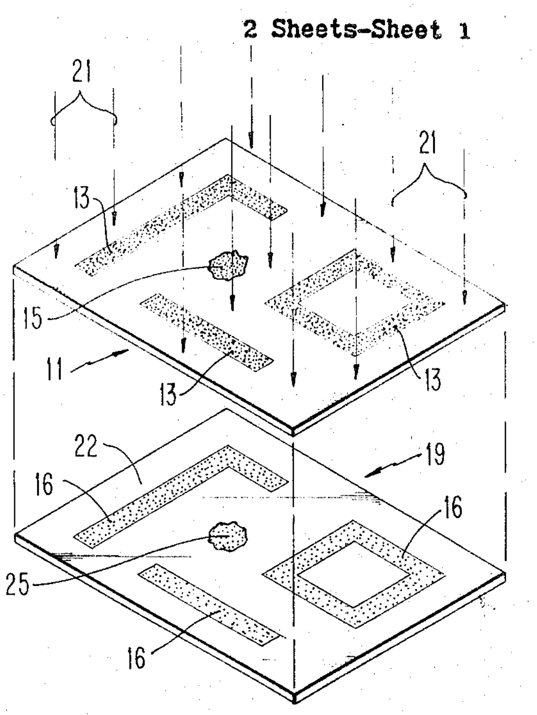
Figures 1C, 1D:
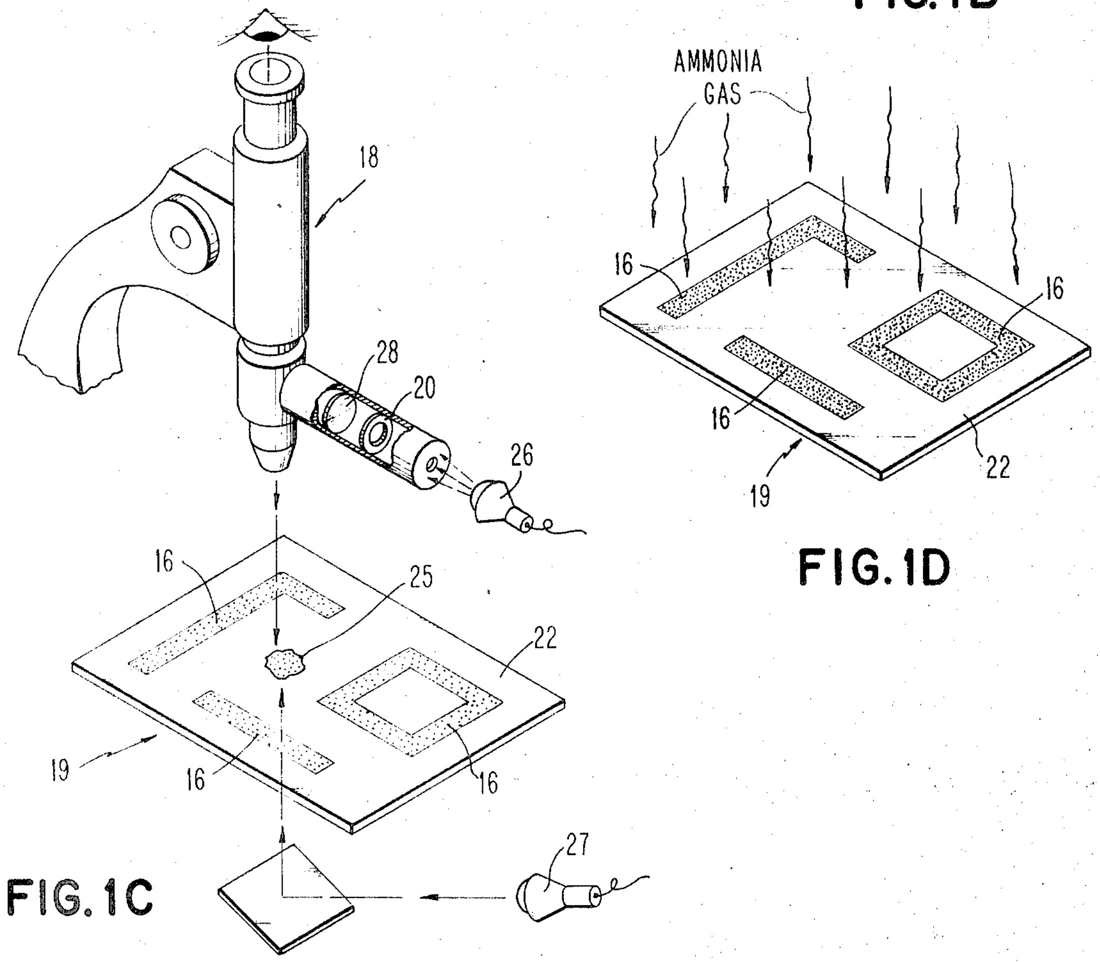

Turning now to FIG. 1A, a single segment mask 11 for example, a silver emulsion mask such as is formed by a computer controlled maks generating apparatus has a pattern of opaque areas 13. Such single segment masks are normally used in a step and repeat process to generate an array of such segments to form a second mask which is used in a single exposure to generate an array of images or chips on the surface of a semiconductor wafer. Errors in the mask generating process or the presence of dust or dirt sometimes causes unwanted opaque areas 15 to occur. Such areas are difficult to correct. The computerized generation of a single segment mask is time consuming to repeat because it requires a multitude of exposures. In accordance with one aspect of the invention, mask 11 is used to expose a several microns thick coating 17 of light sensitive diazo material on a substrate 19 which is a transparent material for example, glass. The exposure uses a source 21 of actinic radiation as shown in FIG. 1B. The exposed areas 22 of the diazo layer 17 are rendered colorless. The unexposed defect area 15 is repeated in the coating 17 at 25. This defect area 25 is visually discernible because it retains its original color (usually a yellow tint) as do unexposed pattern areas 16 which correspond to the opaque areas in mask 11. Prior to developing the diazo dye image with, for example, dry ammonia gas, the defect area is removed. The defect area 25 is readily located under a microscope such as a dual illumination microscope 18 schematically shown in FIG. 1C using, for example, a filtered incandescent light source 27 which does not further expose the diazo layer. The defect can be located because it is visible as a colored spot in the surrounding clear exposed areas 22. A variable size and shape aperture 20 is then visually oriented over the defect 25 and the area 25 is selectively exposed for about 2 minutes by directing actinic radiation through the aperture. The aperture aligning light source and the exposing light source can be the same source 26 for example a mercury ultraviolet source by the use of a suitable removable filter 28 as is well known in the art. When all of the unwanted opaque areas have been located and selectively exposed such that the original color of the diazo material is no longer visible, a permanent defect-free diazo dye mask pattern is formed by developing the diazo material in the unexposed pattern areas such as by exposing it to dry ammonia gas.

Figures 2A, 2C:
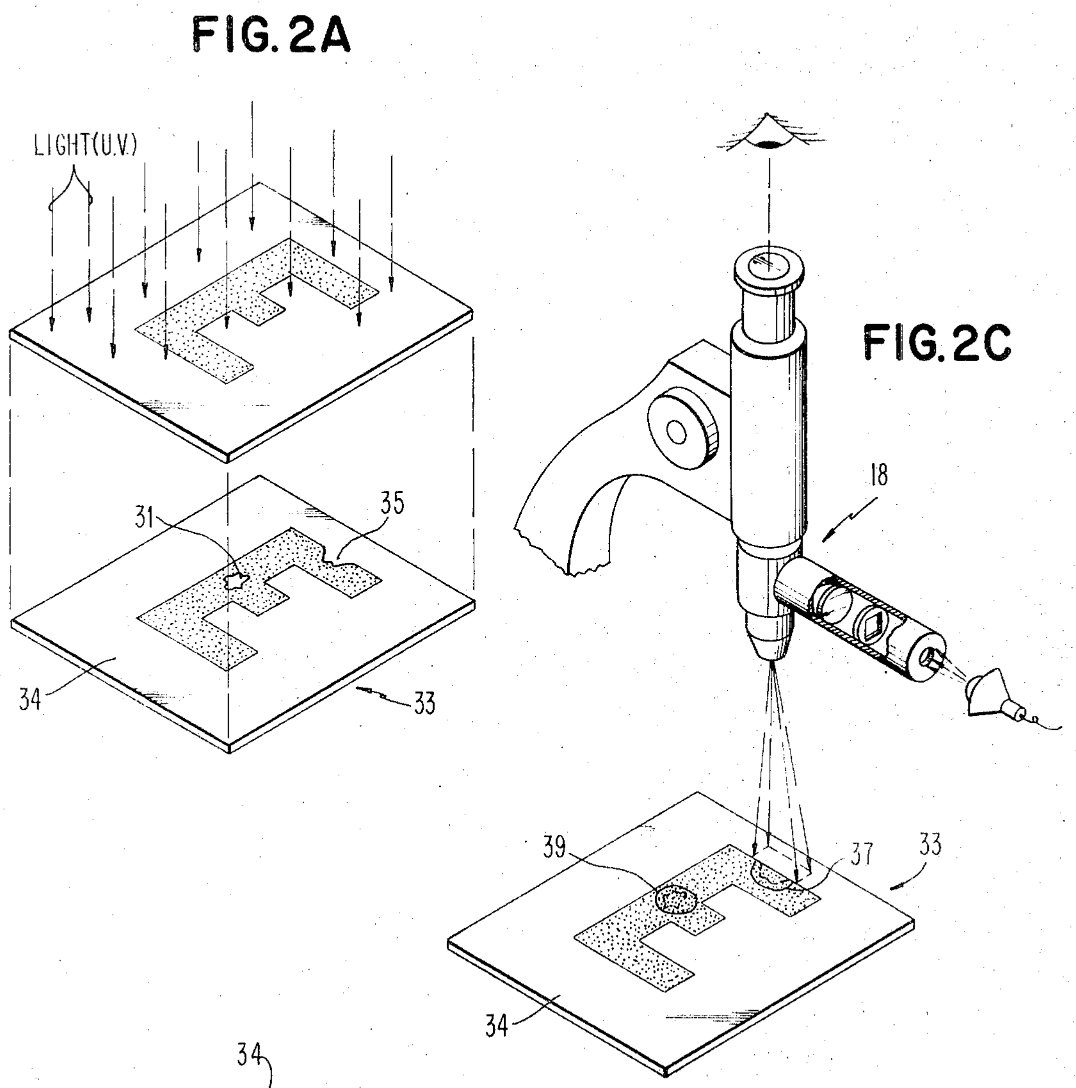
FIGS. 2A–D are a schematic illustration of an embodiment of the process of the invention showing the correction of missing geometry and pin holes in a mask pattern.
Figure 2B:
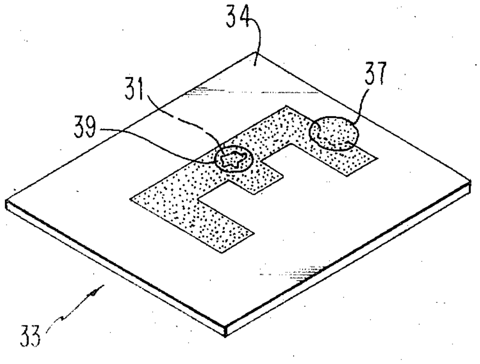
Figure 2D:
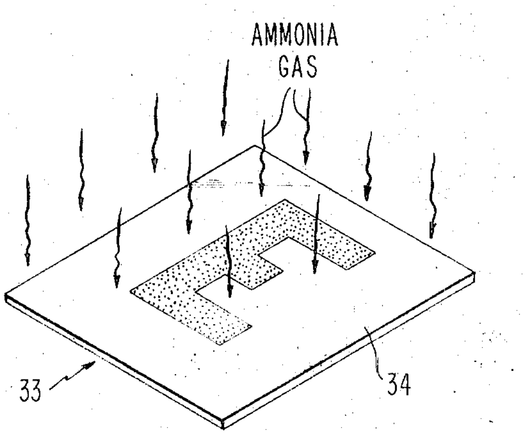

FIGS. 2A–D illustrate the correction of transparent defects such as pin holes 31 and area 35 of missing geometry in a mask 33 which can be formed from either a silver emulsion, diazo, or metal layer on a transparent substrate 34. Pin hole 31 and area 35 are covered with a drop of a solvent solution of unexposed light sensitive diazo material such as p-diazo diethyl aniline boron tetrafluoride, 4-bromo-3,5-resorcylic acid and N-benzyl acetoacetamide in methyl ethyl ketone as described, for example, in IBM TDB, vol. 15, No. 2, p. 425, July 1972 to form diazo layers 37 and 39, respectively. Pin hole 31 is rendered opaque directly by development of the diazo layer 39 because the excess diazo is over an opaque area. The diazo layer 37 however, is larger than the desired opaque geometry of the mask pattern. The excess diazo material is therefore pattern exposed using the variable aperture microscope exposure device 18 to align and selectively spot expose and excess diazo material. Because the exposed area becomes colorless, the result of each spot exposure to eliminate the unwanted portions of layer 37 is readily discernible to the operator so that no unwanted opaque areas will remain upon development of the diazo material. The remaining unexposed diazo areas are then developed to produce a corrected mask as shown in FIG. 2D. The corrected mask areas can be used to expose photoresist because the developed diazo material is a suitable masking material for resist exposure.

It should be understood that the correction processes of FIGS. 1 and 2 can be combined to correct both opaque and clear defects on the same mask concurrently.

A diazo layer can be used and corrected initially in the generation of a single segment mask. However, diazo material is much slower than, for example, silver emulsions so that diazo is less desirable to use in such mask generation processes. Because the above described correction processes require only a few exposures, the speed of the diazo material is of less importance. Therefore, a corrected diazo mask can be readily prepared from a computer generated emulsion mask which contains defects.

Suitable light sensitive diazo compounds for use in the practice of the process of invention are well known in the art. See for example the text Kosar Light Sensitive Systems, John Wiley and Sons, 1955, pp. 194–320. Suitable compounds are commercially available. For example, dry ammonia gas developable diazo coatings on glass for mask making are sold by General Aniline Film Corporation under the trade name of Microline Plates. Another suitable example of a diazo material which has reduced moisture sensitivity is described in IBM TDB, vol. 15, No. 2, p. 425, July 1972. This diazo system includes p-diazo diethyl aniline $BF_4$, 4-bromo-3,5-resorcylic acid, and N-benzyl acetoacetamide.

Although the invention has been described with respect to preferred embodiments thereof, it will be understood by those skilled in the art that the foregoing and other changes in form and detail may be made therein without departing from the spirit and scope of the invention.

What is claimed is:

1. Process for forming an exposure mask comprising the steps of:

providing a transparent substrate having formed thereon a light sensitive layer of diazo material, having a discernible color;

exposing said layer patternwise to actinic radiation such that the exposed portion of said layer becomes transparent;

visually examining said layer with the aid of a microscope, using light which does not act to further expose said diazo material, in order to locate any defect areas which remain colored and which should have been exposed and made transparent by the actinic radiation and were not;

positioning a shaped aperture between a source of actinic light and said layer such that said defect areas are in the path of said aperture;

exposing said defect areas to said source of actinic light through said aperture; and reacting the remaining unexposed diazo material with a developer to form a patterned diazo dye image on said substrate.

2. The process of claim 1 wherein said patternwise exposure is made using a defective exposure mask which is known to contain opaque defects.

3. The process of claim 2 wherein said defective mask is a single segment mask.

4. The process of claim 1 including, subsequent to the said reacting the remaining unexposed diazo material with a developer, the steps of:

locating during said visual examination any transparent defect areas which should not have been exposed by the actinic radiation and where;

coating a new layer of said diazo material on said transparent defect areas;

positioning a shaped aperture such that any excess portion of said new layer which covers non-defect areas is in the path of said aperture; and exposing said excess portion of said new layer to said source of actinic light through said aperture.

5. Process for correcting an exposure mask, said mask including a patterned layer of material, which is opaque to photoresist exposing radiation, coated on a transparent substrate and said layer containing transparent defect areas, comprising the steps of:

coating said defect areas of said mask with a light sensitive layer of diazo material having a discernible color;

positioning a shaped aperture such that any excess portion of said layer which covers non-defect transparent areas of said substrate is in the path of said aperture;

exposing said excess portion of said light sensitive layer to a source of actinic light through said aperture, and reacting the remaining unexposed portions of said light sensitive layer with a developer to produce a diazo dye image.

References Cited

UNITED STATES PATENTS

| | | | |
|---|---|---|---|
| 3,647,445 | 3/1972 | Burns | 96—35 |
| 3,317,320 | 5/1967 | Reber | 96—36.2 |
| 3,598,604 | 8/1971 | Depuy | 96—44 |
| 3,536,407 | 10/1970 | Sandlin | 96—27 R |
| 3,450,532 | 6/1969 | Fichter | 96—27 R |
| 3,748,975 | 7/1973 | Tarabocchia | 96—27 E |

DAVID KLEIN, Primary Examiner

E. C. KIMLIN, Assistant Examiner

U.S. Cl. X.R.

96—27 R, 44